United States Patent [19]
Mendolia et al.

[11] Patent Number: 5,717,577
[45] Date of Patent: Feb. 10, 1998

[54] GASKETED SHIELD CAN FOR SHIELDING EMISSIONS OF ELECTROMAGNETIC ENERGY

[75] Inventors: Gregory S. Mendolia; Benjamin O. Roderique, both of Forest; David R. Droege, Lynchburg, all of Va.

[73] Assignee: Ericsson, Inc., Research Triangle PK, N.C.

[21] Appl. No.: 742,818

[22] Filed: Oct. 30, 1996

[51] Int. Cl.⁶ .......................................... H05K 9/00
[52] U.S. Cl. .................... 361/818; 361/796; 361/816; 361/800; 361/753; 174/35 R; 174/35 GC
[58] Field of Search ................................ 361/816, 752, 361/753, 796, 818, 800, 736, 799; 174/35 R, 35 GC; 267/167; 307/89, 90, 91; 333/12; 324/200

[56] References Cited

U.S. PATENT DOCUMENTS

| | | | |
|---|---|---|---|
| 5,006,666 | 4/1991 | Laborie | 174/35 GC |
| 5,043,848 | 8/1991 | Rogers et al. | 361/816 |
| 5,150,282 | 9/1992 | Tomura et al. | 174/35 R |
| 5,175,395 | 12/1992 | Moore | 174/35 MS |
| 5,436,802 | 7/1995 | Trahan | 361/816 |
| 5,438,482 | 8/1995 | Nakamura et al. | 361/816 |
| 5,474,309 | 12/1995 | Balsells | 174/35 GC |
| 5,506,373 | 4/1996 | Hoffman | 174/35 GC |
| 5,508,889 | 4/1996 | Ii | 361/816 |
| 5,550,713 | 8/1996 | Pressler et al. | 361/818 |
| 5,557,507 | 9/1996 | Koike et al. | 361/816 |
| 5,566,055 | 10/1996 | Salvi, Jr. | 361/816 |

*Primary Examiner*—William M. Shoop, Jr.
*Assistant Examiner*—Peter Ganjian
*Attorney, Agent, or Firm*—Jenkens & Gilchrist, P.C.

[57] ABSTRACT

The present invention places a semi-lossy gasket between a printed circuit board ground pad ring and a metal shield can for shielding electronic components and circuitry which generate electromagnetic radiation. The present invention also provides a variety of means for aligning and mounting the shield can and gasket to the printed circuit board. Guide pins extending from the shield can extend through apertures in the printed circuit board for aligning the shield can to the printed circuit board. The guide pins can be bent or soldered to the printed circuit board and can also include a hooked end for latching on to the printed circuit board.

14 Claims, 4 Drawing Sheets

GASKETED SHIELD CAN FOR SHIELDING EMISSIONS OF ELECTROMAGNETIC ENERGY

BACKGROUND OF THE INVENTION

1. Technical Field of the Invention

The present invention pertains in general to the shielding of electronic components and printed circuits, and more particularly, to the use of a gasket constructed from a semi-lossy material and positioned between a shield can and a printed circuit board.

2. Description of Related Art

Due to a variety of factors, including Federal Communication Commission requirements, cellular telephones and other electronic devices require shielding to inhibit the emission of electromagnetic radiation generated by electronic components and circuitry. The goal in all approaches to shielding of electromagnetic emissions is to surround the electronic components generating the electromagnetic emissions in an electrically conductive capsule that is electrically connected to ground. Within cellular telephones there are two basic approaches to accomplish such shielding.

In a first approach, the cellular telephone housing is constructed of a conductive material, either metal or metalized plastic and is used to form all or a part of the conductive capsule. Typically, the housing is made of a front and a rear housing/cover which mate with each other and the printed circuit board to hold the printed circuit board within the two housings. Mating typically occurs along the perimeter of the two housings and the printed circuit board. To inhibit the emission of electromagnetic radiation, a semi-lossy conductive gasket(s) is (are) placed along the perimeter of the two housings to make an electrical contact between the conductive housings and a ground pad ring located along the perimeter of the printed circuit board. The ground pad ring is connected to an inner layer ground plane using via holes to supplement the shielding of the front housing which has openings for keys and a display. This provides a radio frequency seal and creates a conductive capsule within the two housings of the cellular telephone. This first approach to providing electromagnetic shielding is a costly solution due to the expense of the metal or metalized plastic housings. Furthermore, there is a risk that the conductive housings may come into physical contact with the electronic components on the printed circuit board causing short circuits.

A second approach to shielding electromagnetic emissions is to place a shield can made of conductive metal over the electronic components or circuitry requiring shielding. The shield can is typically soldered to a ground pad ring on the printed circuit board to make a direct electrical connection to an inner layer ground plane shielding the electronic components from the backside. Thus, the shielded electronic components are surrounded in an electrically conductive capsule comprised of the shield can and the ground plane. This approach to shielding is a very low cost solution with respect to material costs. Labor costs associated with inspection, troubleshooting, and repair of the telephone, including application, removal, and replacement of the shield can, however, are very high. Furthermore, should the shield can need to be removed in order to repair an electronic component or circuitry, there is the possibility of damage to these and other nearby components during the repair process. Soldered-down shield cans also degrade the performance of radio frequency circuits located under the shield can due to the low profile of the can, which places a reflective ground plane directly above the components and circuits. Unlike the first approach to shielding which incorporates a semi-lossy gasket to attenuate the electromagnetic radiation, the use of soldered down shield cans provides no attenuation of the electromagnetic emissions. Instead of attenuating the radio frequency energy and converting it to heat, the electromagnetic radiation is almost entirely reflected by the shield can and causes unwanted cross-talk between the components and circuitry located beneath the shield can. It would be advantageous, therefore, to devise an electromagnetic shielding device which can be easily removed from the printed circuit board to facilitate repairs of the electronic components and circuitry contained beneath the shield can.

SUMMARY OF THE INVENTION

The present invention comprises a printed circuit board having a ground plane located beneath electronic components and circuitry which generate electromagnetic radiation and are to be shielded. The printed circuit board also has a ground pad ring on the surface of the printed circuit board surrounding the electronic components and circuitry which are to be shielded. The ground pad ring is composed of an electrically conductive material such as gold printed in the surface of the printed circuit board. The ground pad ring is electrically connected to the ground plane using via holes within the printed circuit board. A semi-lossy gasket is placed over the ground pad ring on the surface of the printed circuit board and a metal shield can is placed on top of the semi-lossy gasket. Alternatively, the semi-lossy gasket can be placed onto the base of the shield can, and the combination placed onto the ground pad ring. Various means are used to align and mount the shield can to the printed circuit board.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
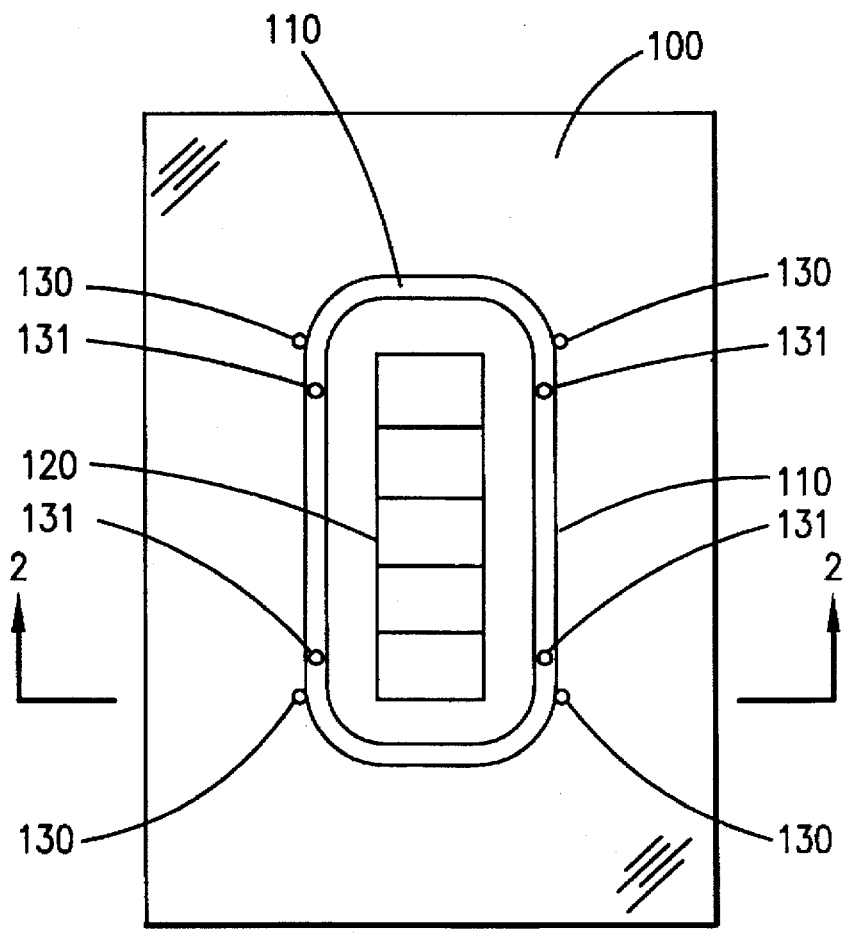
FIG. 1 is a top view of a printed circuit board for mounting a gasketed shield can of the present invention.

Referring now to FIG. 1, there is illustrated a top view of a printed circuit board 100 used in electronic devices including cellular telephones. Located on the surface of the printed circuit board 100 is a ground pad ring 110 constructed from an electrically conductive material. The ground pad ring 110 surrounds the electronic components and circuitry 120 which generate the electromagnetic emissions to be shielded. Although FIG. 1 depicts the shield can and ground pad ring as rectangular, the shield can and ground pad ring may be any shape. In one embodiment of the present invention, one or more apertures 130 are drilled through the printed circuit board 100 along the outside edge of the ground pad ring 110. Alternatively, apertures 131 can be placed on the ground pad ring 110. These apertures 130 or 131 are used to align a shield can which is placed over the electronic components 120.

Figure 2A:
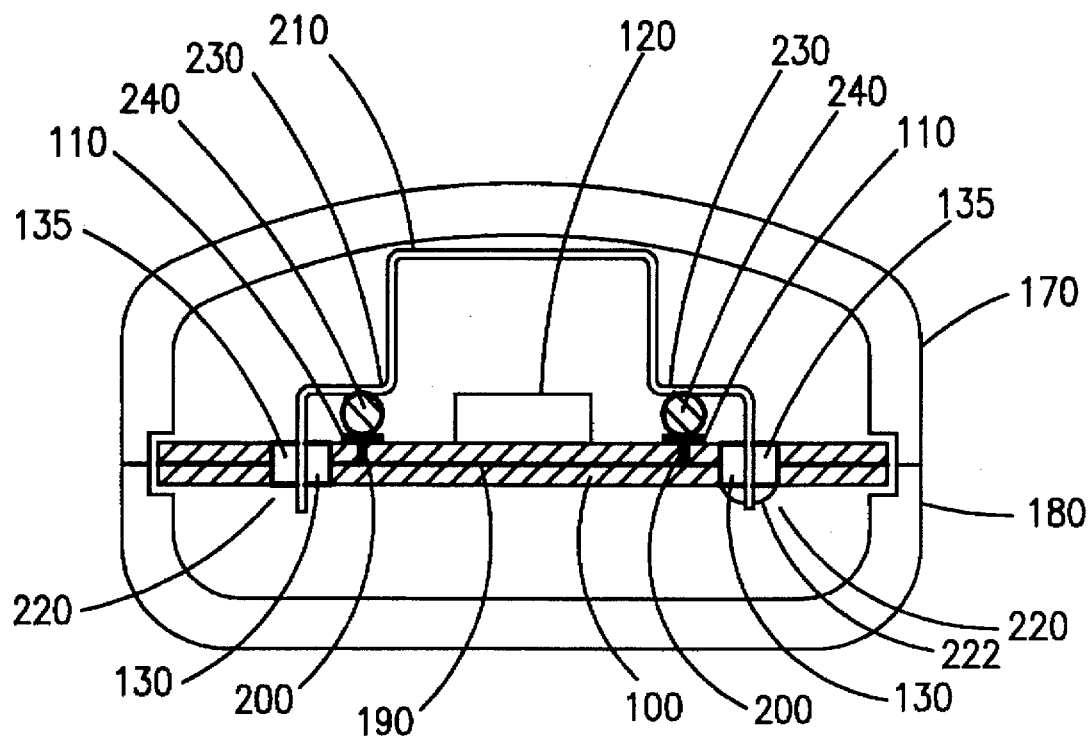
FIG. 2A is a cross-sectional view, taken along lines 2—2 of FIG. 1, of the printed circuit board, including a first embodiment of a gasketed shield can of the present invention.

Referring additionally now to FIG. 2A, there is illustrated a cross-sectional view of the printed circuit board 100, of FIG. 1, mounted between a rear portion 170 and a front portion 180 of an electronic device housing. The printed circuit board is constructed of multiple layers and has a ground plane 190 which can be located on any one of the layers of the printed circuit board 100. The ground plane 190 located beneath the electronic components and circuitry 120 is connected to the ground pad ring 100 by means of a via 200. The shield can 210 includes guide pins 220 which extend through the printed circuit board apertures 130. In this embodiment of the present invention, frictional forces created between the surface edges of the shield can guide pins 220, and the inner surface 135 of printed circuit board apertures 130 hold the shield can 210 to the printed circuit board 100. Alternatively or additionally, the guide pins 220 are soldered 222 to the printed circuit board 100 to provide further structural strength. The guide pins 220 and printed circuit board apertures 130 also align the shield can 210 over the ground pad ring 110 located on the surface of the printed circuit board 100. Sandwiched between the ground pad ring 110 and a lip 230 of the shield can 210, is a conductive semi-lossy gasket 240. The lip 230 of the shield can 210 extends along the entire perimeter of the shield can which also follows and is aligned with the trace of the ground pad ring 110. The semi-lossy conductive gasket 240 extends continuously along the perimeter of the shield can lip 230. An electrically conductive path is created between the shield can 210, the gasket 240, the ground pad ring 110, and the ground plane 190. This conductive path, taken in all three dimensions, creates an electrically conductive capsule surrounding the electronic components and circuitry 120. As electromagnetic radiation is emitted from the electronic components and circuitry 120, the semi-lossy gasket 240 converts a portion of the electromagnetic energy into heat, thereby attenuating the electromagnetic emissions and reducing reflections.

Figure 2B:
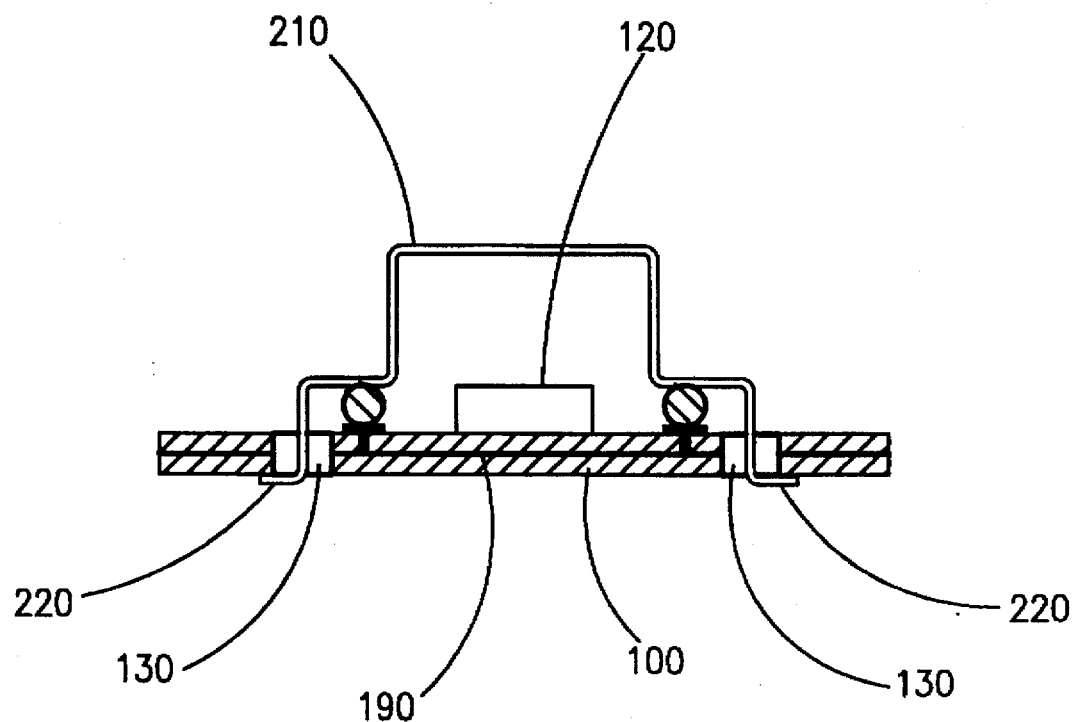
FIG. 2B is a cross-sectional view, taken along the lines 2—2 of FIG. 1, of the printed circuit board including a second embodiment of a gasketed shield can.

Referring additionally now to FIG. 2B, there is illustrated a second embodiment of the present invention. Guide pins 220 of shield can 210 are inserted through apertures 130 and pressure is applied to compress the gasket. The guide pins are then bent at a 90 degree angle at and against the bottom of the printed circuit board 100. The bent guide post pins 220 hold the shield can 210 to the printed circuit board 100. Additionally, the pins 220 may be soldered to the printed circuit board 100 providing further structural strength.

Figure 2C:
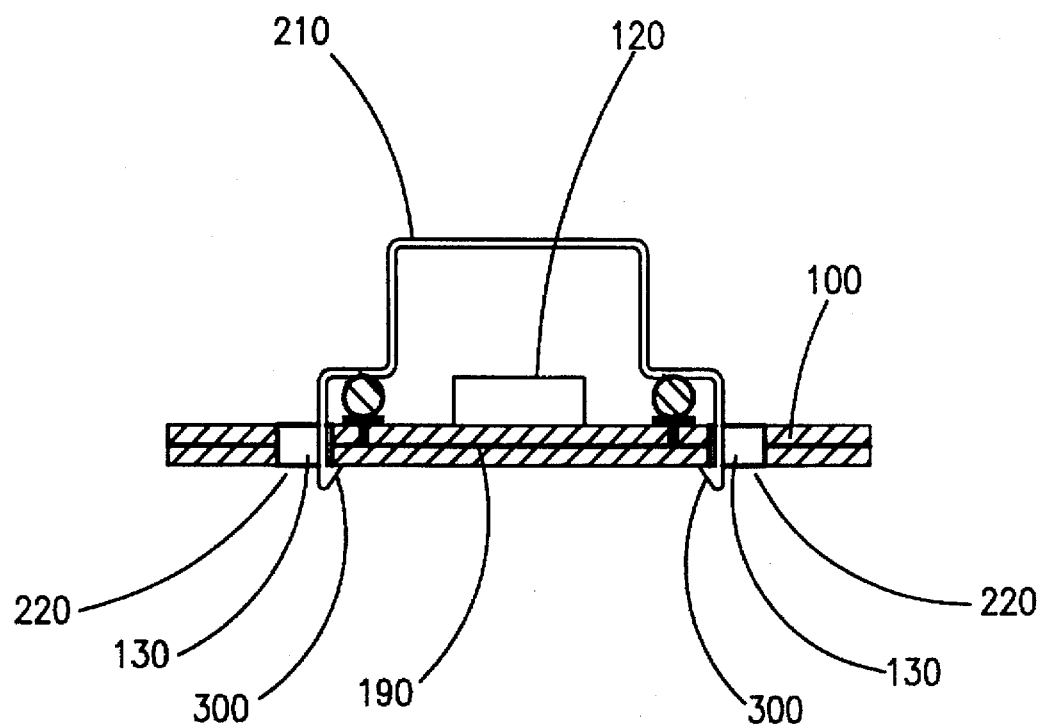
FIG. 2C is a cross-sectional view, taken along the lines 2—2 of FIG. 1, of the printed circuit board including a third embodiment of a gasketed shield can.

Referring additionally now to FIG. 2C, there is illustrated a third embodiment of the present invention. Guide pins 220 include hooked ends 300 which are inserted into the printed circuit board apertures 130 from the top of printed circuit board 100 during assembly. After being pushed through to the bottom of printed circuit board 100, the hooked ends 300 latch onto the bottom surface printed circuit board 100 to hold the shield can 210 to the printed circuit board 100.

Figure 2D:
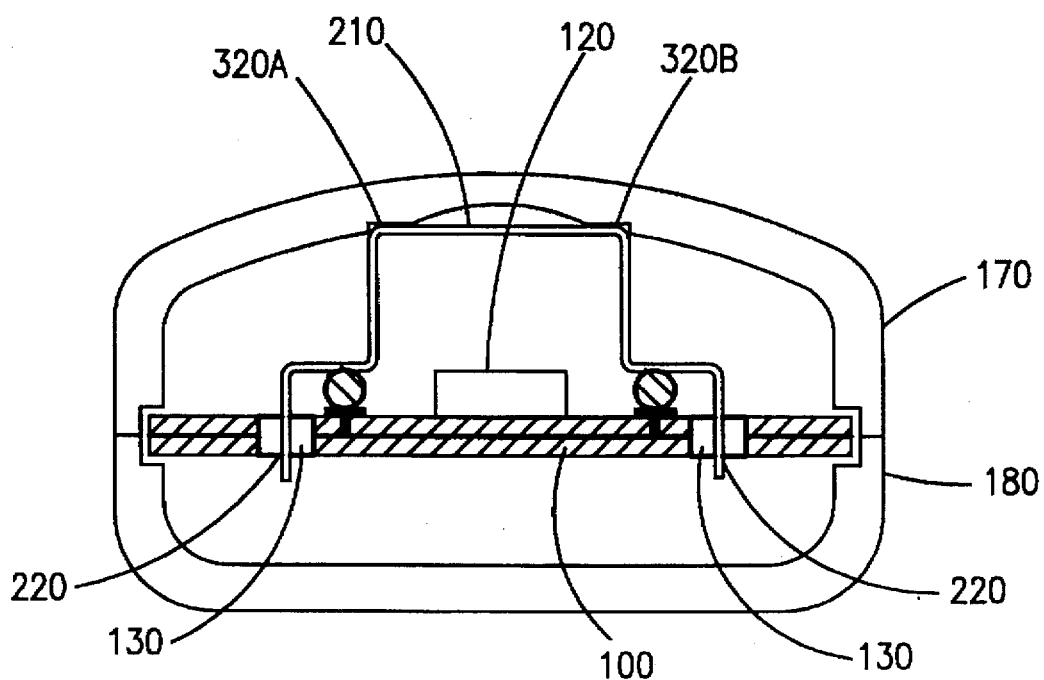
FIG. 2D is a cross-sectional view, taken along the lines 2—2 of FIG. 1, of the printed circuit board including a fourth embodiment of a gasketed held can.

Referring additionally now to FIG. 2D, there is illustrated a fourth embodiment of the present invention. This embodiment of the present invention is identical to that described in FIG. 2A, and further includes notches 320A and 320B carved in the rear housing 170 to align the shield can 210 with the printed circuit board 100 and hold the shield can 210 against the printed circuit board 100. A plurality of notches, including notches 320A and 320B can be located at various points along the top of shield can 210 or can be a continuous notch along the entire top of shield can 210. Although FIG. 2D shows the shield can 210 as having guide pins 220 extending through the printed circuit board apertures 130 for alignment of the shield can 210 with the printed circuit board 100, they are optional as notches 320A and 320B in the rear housing 170 are sufficient to align and hold the shield can 210 to the printed circuit board 100.

Figure 2E:
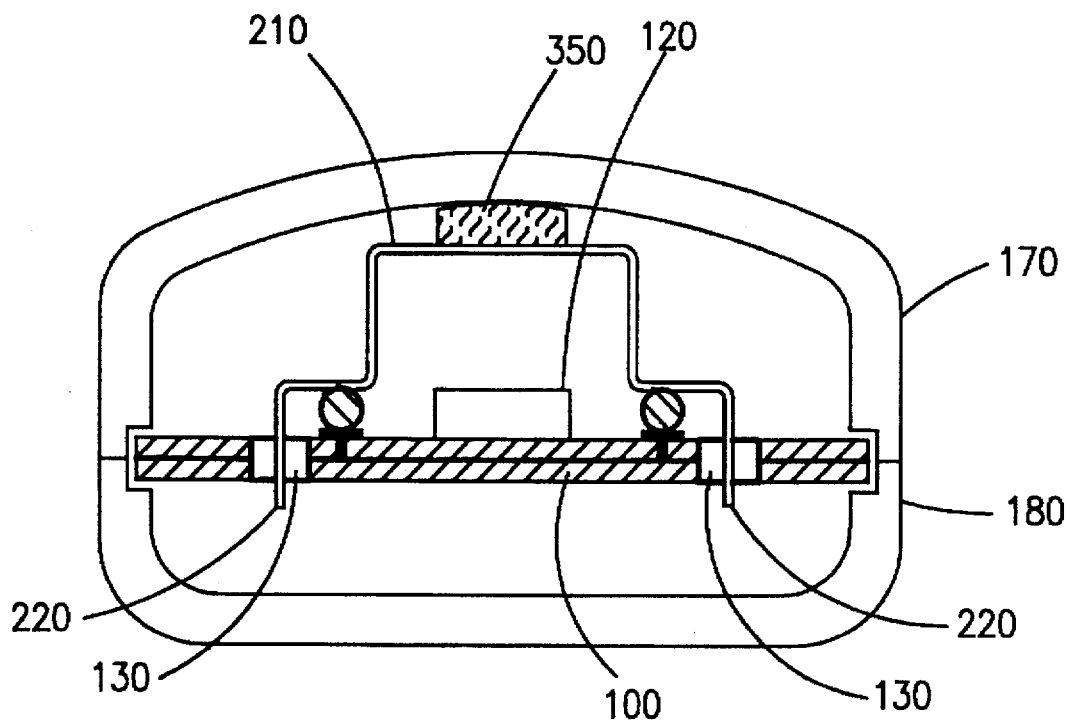
FIG. 2E is a cross-sectional view, taken along the lines 2—2 of FIG. 1, of the printed circuit board including a fifth embodiment of a gasketed shield can.

Referring additionally now to FIG. 2E, there is shown a fifth embodiment of the present invention. This embodiment is similar to the embodiment depicted in FIG. 2D except that the rear housing 170 does not contain notches 320A and 320B. Instead, a stand-off 350 made of a spongy material is located between the top of shield can 210 and the rear housing 170. The stand-off 350 provides sufficient pressure between the rear housing 170, the shield can 210, and the printed circuit board 100 to hold the shield can 210 against the printed circuit board 100.

Figure 2F:
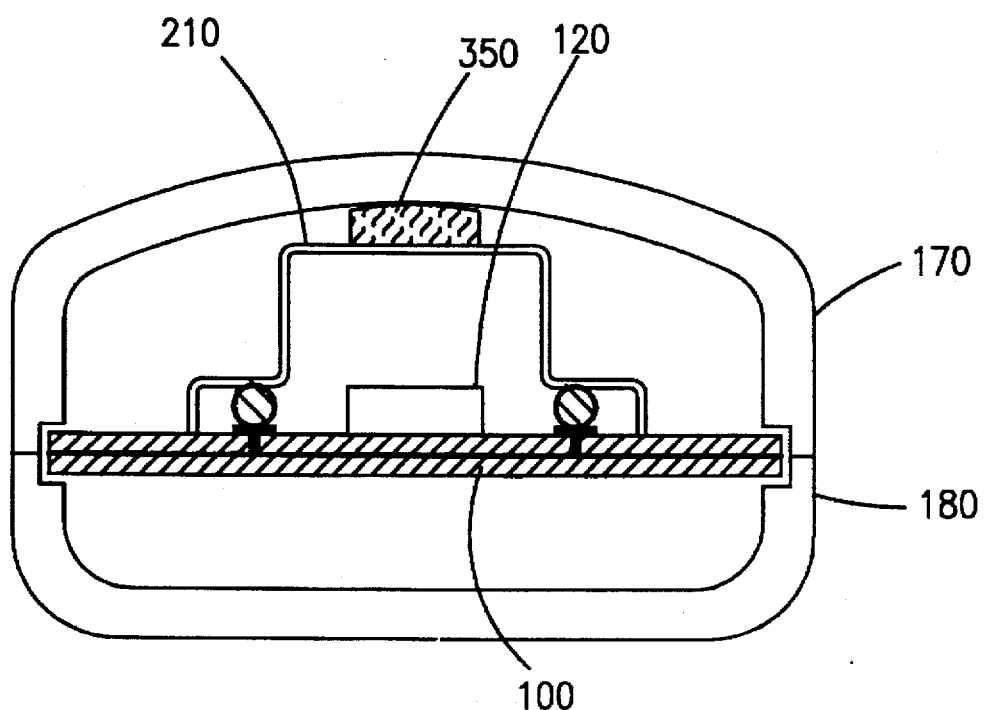
FIG. 2F is a cross-sectional view, taken along the lines 2—2 of FIG. 1, of the printed circuit board including a sixth embodiment of a gasketed shield can.

Referring additionally now to FIG. 2F, there is shown a sixth embodiment of the present invention. This embodiment is similar to the embodiment depicted in FIG. 2E except that the shield can 210 does not include guide pins 220 and the printed circuit board 100 contains no holes 130. The stand-off 350 provides sufficient pressure between the rear housing 170, the shield can 210, and the printed circuit board 100 to hold the shield can 210 against the printed circuit board 100.

In all of the embodiments described, the shield can 210 can easily be removed from the printed circuit board 100 to facilitate repairs to the electronic components and circuitry 120 located beneath the shield can 210. Even the soldered guide pins are less labor-intensive to solder or remove than conventional soldered-down cans where the entire perimeter of the shield can is soldered. Furthermore, there is a much lower probability of shorting to adjacent components and traces.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. An apparatus for shielding electromagnetic emissions created by electronic components and circuitry, comprising:

a printed circuit board for mounting the electronic components, the printed circuit board including a ground plane, and the printed circuit board further including a ground pad ring located on a top surface of the printed circuit board surrounding the electronic components;

means for electrically connecting the ground pad ring to the ground plane;

a shield can having a lip extending along a perimeter, the lip substantially aligned with the ground pad ring; and a gasket constructed of a semi-lossy conductive material positioned between the lip along the perimeter of the shield can and the ground pad ring to provide a conductive seal therebetween and further to attenuate electromagnetic emissions within the shield can.

2. The apparatus of claim 1, wherein the shield can includes at least one guide pin extending from the shield can, and wherein the printed circuit board has at least one corresponding aperture for receiving the guide pin for alignment and mounting of the shield can to the printed circuit board.

3. The apparatus of claim 2, wherein the guide pin extends through the printed circuit board aperture and is bent horizontal to the printed circuit board.

4. The apparatus of claim 2, wherein the guide pin is soldered to the printed circuit board.

5. The apparatus of claim 1, wherein the shield can includes a guide pin extending from the shield can and having a hooked end, and wherein the printed circuit board has an aperture for receiving the guide pin for alignment of the shield can to the printed circuit board, the guide pin extending through the printed circuit board aperture and the hooked end for latching onto the printed circuit board.

6. An apparatus for shielding electromagnetic emissions created by electronic components and circuitry, comprising:
- a printed circuit board for mounting the electronic components, the printed circuit board including a ground plane, and the printed circuit board further including a ground pad ring located on a top surface of the printed circuit board surrounding the electronic components;
- means for electrically connecting the ground pad ring to the ground plane;
- a shield can having a lip extending along a perimeter, the lip substantially aligned with the ground pad ring; and
- a gasket constructed of a semi-lossy conductive material positioned between the lip along the perimeter of the shield can and the ground pad ring to provide a conductive seal therebetween and further to attenuate electromagnetic emissions within the shield can;
- a means for aligning the shield can to the printed circuit board; and
- a means for affixing the shield can to the printed circuit board.

7. The apparatus recited in claim 6, wherein the means for aligning and mounting the shield can to the printed circuit board includes at least one guide pin extending from the shield can, and wherein the printed circuit board has at least one corresponding aperture for receiving the guide pin.

8. The apparatus recited in claim 7, wherein the guide pin extends through the printed circuit board aperture and is bent horizontal to the printed circuit board.

9. The apparatus recited in claim 7, wherein the guide pin is soldered to the printed circuit board.

10. The apparatus of claim 6, wherein the means for aligning and mounting the shield can to the printed circuit board includes at least one guide pin extending from the shield can and having a hooked end, and wherein the printed circuit board has an aperture for receiving the guide pin for alignment of the shield can to the printed circuit board, the guide pin extending through the printed circuit board aperture and the hooked end for latching onto the printed circuit board.

11. The apparatus of claim 6, wherein the means for aligning and mounting the shield can to the printed circuit board includes:
- a housing for mounting the printed circuit board thereto, the housing having at least one notch; and
- the notch for holding the shield can in place over the ground ring.

12. The apparatus of claim 6, wherein the means for aligning and mounting the shield can to the printed circuit board includes:
- a housing for mounting the printed circuit board thereto; and
- a stand-off positioned between the housing and the shield can for holding the shield can in place over the ground ring.

13. The apparatus of claim 12, wherein the shield can includes at least one guide pin extending from the shield can, and wherein the printed circuit board has at least one corresponding aperture for receiving the guide pin.

14. An electronic device comprising:
- a housing for mounting and encapsulating a printed circuit board;
- a printed circuit board for mounting electronic components, the printed circuit board including a ground plane, and the printed circuit board further including a ground pad ring located on a top surface of the printed circuit board surrounding the electronic components;
- means for electrically connecting the ground pad ring to the ground plane;
- a shield can having a lip extending along a perimeter, the lip substantially aligned with the ground pad ring; and
- a gasket constructed of a semi-lossy conductive material positioned between the lip along the perimeter of the shield can and the ground pad ring to provide a conductive seal therebetween and further to attenuate electromagnetic emissions within the shield can.

* * * * *